US010431582B2

(12) United States Patent
Fu et al.

(10) Patent No.: US 10,431,582 B2
(45) Date of Patent: Oct. 1, 2019

(54) HIGH SPEED SEMICONDUCTOR DEVICE

(71) Applicant: TAIWAN SEMICONDUCTOR MANUFACTURING COMPANY, LTD., Hsinchu (TW)

(72) Inventors: Shu Fang Fu, Xinpu Township (TW); Chi-Feng Huang, Zhubei (TW); Chia-Chung Chen, Keelung (TW); Victor Chiang Liang, Hsinchu (TW); Fu-Huan Tsai, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/255,370

(22) Filed: Sep. 2, 2016

(65) Prior Publication Data
US 2017/0345821 A1 Nov. 30, 2017

Related U.S. Application Data

(60) Provisional application No. 62/343,735, filed on May 31, 2016.

(51) Int. Cl.
*H01L 27/088* (2006.01)
*H01L 21/8238* (2006.01)
*H01L 29/78* (2006.01)
*H03K 3/03* (2006.01)

(52) U.S. Cl.
CPC .. *H01L 27/0886* (2013.01); *H01L 21/823807* (2013.01); *H01L 21/823821* (2013.01); *H01L 21/823871* (2013.01); *H01L 21/823878* (2013.01); *H01L 29/7835* (2013.01); *H03K 3/0315* (2013.01)

(58) Field of Classification Search
CPC ..... H01L 21/823807; H01L 21/823821; H01L 21/823871; H01L 21/823878; H01L 27/0886; H01L 29/7835; H03K 3/0315
See application file for complete search history.

(56) References Cited

U.S. PATENT DOCUMENTS

| | | | | |
|---|---|---|---|---|
| 5,019,520 | A * | 5/1991 | Komori | H01L 29/105 257/E29.055 |
| 5,759,901 | A * | 6/1998 | Loh | H01L 21/26586 438/217 |
| 8,748,270 | B1 * | 6/2014 | Shifren | H01L 29/66659 257/E21.443 |
| 9,076,869 | B1 | 7/2015 | Hu et al. | |
| 9,859,386 | B2 | 1/2018 | Ho | |
| 2013/0193526 | A1 * | 8/2013 | Lo | H01L 27/0255 257/401 |
| 2013/0214357 | A1 | 8/2013 | Chang | |

(Continued)

OTHER PUBLICATIONS

Office Action dated Jun. 14, 2018 from related U.S. Appl. No. 15/468,880.

*Primary Examiner* — Mark W Tornow
*Assistant Examiner* — Priya M Rampersaud
(74) *Attorney, Agent, or Firm* — Hauptman Ham, LLP

(57) ABSTRACT

A semiconductor device includes a fin extending from a substrate, a first source/drain feature, a second source/drain feature, and a gate structure on the fin. A distance between the gate structure and the first source/drain feature is different from a distance between the gate structure and the second source/drain feature.

20 Claims, 4 Drawing Sheets

(56) References Cited

U.S. PATENT DOCUMENTS

| | | | |
|---|---|---|---|
| 2014/0008733 A1* | 1/2014 | Shrivastava | H01L 21/823807 257/401 |
| 2014/0057405 A1* | 2/2014 | Zhou | H01L 29/7816 438/286 |
| 2014/0273347 A1* | 9/2014 | Tseng | H01L 21/76895 438/107 |
| 2015/0311342 A1 | 10/2015 | Lin | |
| 2016/0141423 A1 | 5/2016 | Diaz | |
| 2016/0260669 A1 | 9/2016 | Paak | |

* cited by examiner

HIGH SPEED SEMICONDUCTOR DEVICE

BACKGROUND

Radio frequency (RF) circuits, such as voltage controlled oscillators ("VCOs"), low noise amplifiers ("LNAs"), and phase locked loops ("PLLs"), are widely used in wireless communication systems. Various RF circuits that operate at high frequencies, for example, in gigahertz (GHz) frequency ranges, are integrated with other devices to form a system. In some instances, the RF circuit is applied to a microwave or millimeter-wave (mmW) apparatus, which usually refers to a device capable of transmitting signals at a frequency approximately 10 GHz to 300 GHz.

In some approaches, the frequency is achieved by thinning a gate dielectric or shallowing a source/drain region. In some embodiments, in order to obtain a lower resistance-capacitance (RC) time constant, a sheet resistance of the gate electrode is reduced. In some approaches, the device is formed to include asymmetric lightly-doped drain (LDD) regions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of various features in the drawings may be arbitrarily increased or reduced for clarity of discussion.

DETAILED DESCRIPTION

Figure 1A:
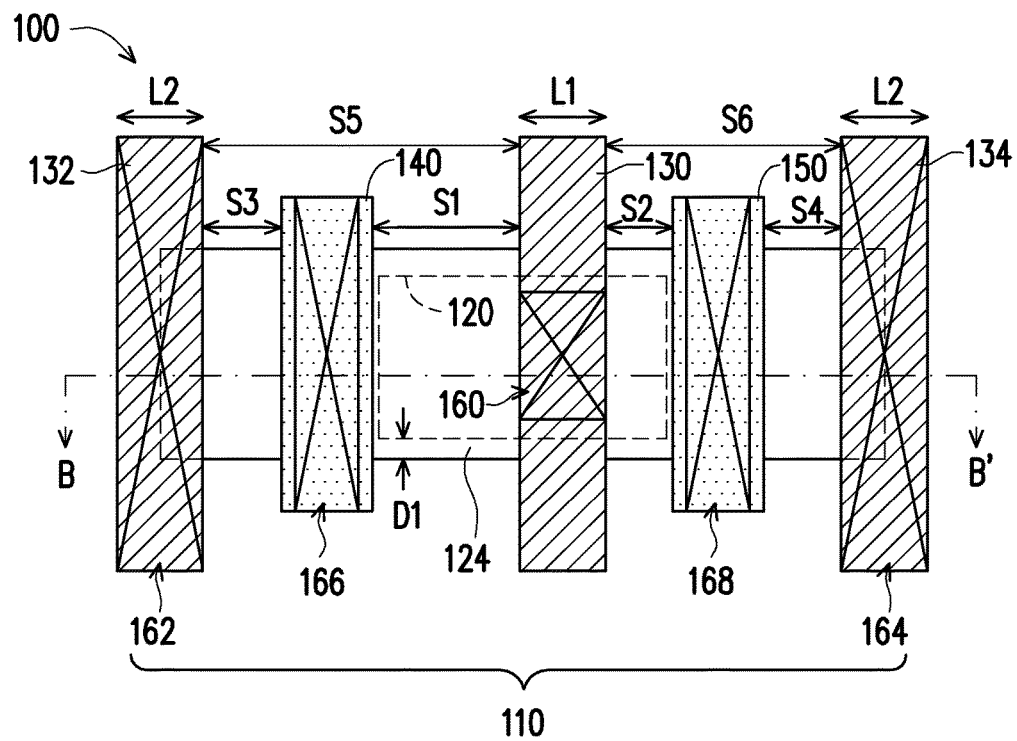
FIG. 1A is a top view of a semiconductor device in accordance with one or more embodiments.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advances in complimentary metal-oxide-semiconductor (CMOS) technology have allowed for reduction in device feature sizes, increases in high IC densities, and an implementation of devices with high processing speeds of applications in a GHz range. However, with smaller process geometries, some parasitic capacitances such as gate-to-contact capacitance (Cco) or gate-to-source/drain fringe capacitance (Cf), even gate-to-metal capacitance have become increasingly important. CMOS devices have become more sensitive to the layout environment and have a significant impact to a circuit performance. For example, due to the Miller effect and the formation of wiring slot contacts of local interconnects, the magnitude of Cco increases by at least two times compared to previous technology, in some instances, accounting for an increasing proportion of time delay and resulting in degradation of the circuit speed. The mismatched performance of these enlarged parasitic capacitances impacts an accuracy of the resulting signal. Reducing parasitic capacitances helps CMOS devices to function within operating parameters/tolerances.

Parasitic capacitances cause various detrimental effects in a designed IC, such as undesired time delays. Thus, reducing the impact of these parasitic capacitances on the performance of the designed IC helps to maintain a high density of interconnects with less delay variation in the circuit performance. In some approaches, by shrinking the gate structure, a magnitude of conductance is increased, thereby decreasing time delay. In some approaches, a channel region is doped to be displaced away from surfaces of a fin to reduce imperfections at the surfaces, which minimizes undesired noise. In some approaches, by extending a distance between a gate structure and at least one of the source/drain features, a magnitude of Cf, Cco and Cm are reduced, resulting in a shorter signal delay in comparison with devices without the extended distance. The source/drain feature is kept in a minimum design rule so that an area of the asymmetric arrangement is maintained as small as possible to reduce an overall size of the designed IC.

FIG. 1A is a top view of a semiconductor device 100 in accordance with one or more embodiments. Semiconductor device 100 includes a semiconductor strip 110, a buried channel region 120 in semiconductor strip 110, a gate structure 130, a first edge structure 132, a second edge structure 134, a first source/drain feature 140 and a second source/drain feature 150, and contact structures 160, 162, 164, 166, 168. Buried channel region 120 is separated from side wall surfaces of semiconductor 110 at a first distance D1. First source/drain feature 140 is formed between gate structure 130 and first edge structure 132, and second source/drain feature 150 is formed between gate structure 130 and second edge structure 134. Gate structure 130 has a first length L1. Each of first edge structure 132 and second edge structure 134 has a second length L2. A first spacing S1 is defined between gate structure 130 and first source/drain feature 140. A second spacing S2 is defined between gate structure 130 and second source/drain feature 150. A third spacing S3 is defined between first source/drain feature 140 and first edge structure 132. A fourth spacing S4 is defined between second source/drain feature 150 and second edge structure 134. A fifth spacing S5 is defined between gate structure 130 and first edge structure 132. A sixth spacing S6 is defined between gate structure 130 and second edge structure 134. In some embodiments, semiconductor device 100 is formed using design rules, such as a minimum spacing rule between adjacent components and/or a minimum length rule for various components. For example, second spacing S2, third spacing S3 and fourth spacing S4 follow the minimum spacing rule under the design rules. In some embodiments, fifth spacing S5 is different from sixth spacing S6. In some embodiments, a ratio of first spacing S1 to second spacing S2 ranges from about 2:1 to about 4:1. In some embodiments, the ratio of first spacing S1 to second spacing S2 ranges from about 2.5:1 to about 3.5:1. In some embodiments, the ratio of first spacing S1 to second spacing S2 is 3:1. If the ratio of first spacing S1 to second spacing S2 is too high, then semiconductor device 100 will occupy more area and a size of semiconductor device 100 is increased, in some instances. If the ratio of first spacing S1 to second spacing S2 is too low, then semiconductor device 100 will have a slow operating time, in some instances.

Figure 1B:
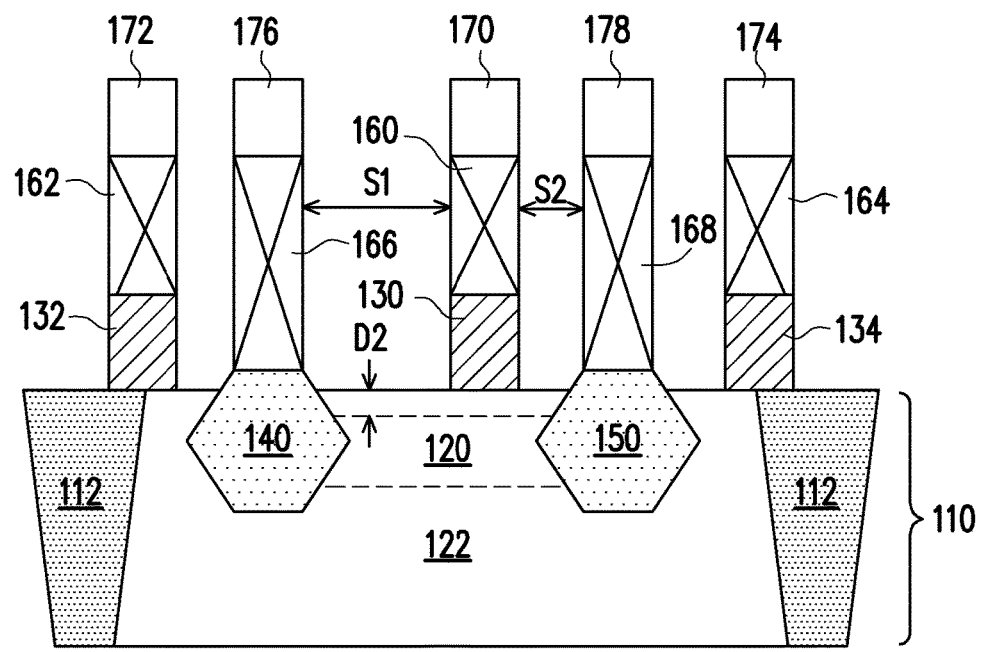
FIG. 1B is a cross-sectional view of the semiconductor device taken along line B-B' in FIG. 1A in accordance with one or more embodiments.

FIG. 1B is a cross-sectional view of semiconductor device 100 taken along line B-B' in FIG. 1A in accordance with one or more embodiments. Semiconductor device 100 further includes isolating features 112, a well region 122, an oxide definition (OD) 124, contact structures 160, 162, 164, 166, 168, and first metal line layers 170, 172, 174, 176, 178. Contact structure 160 is on gate structure 130. Contact structures 162 and 164 are on first edge structure 132 and second edge structure 134, respectively. Contact structures 166 and 168 are on first source/drain feature 140 and second source/drain feature 150, respectively. First metal line layers 170, 172, 174, 176, 178 correspond to contact structures 160, 162, 164, 166, 168, respectively. In some embodiments, contact structures 160, 162, 164, 166, 168 are contact plugs. In some embodiments, contact structures 160, 162, 164, 166, 168 are slot contacts. In some embodiments, at least one of gate structure 130, first edge structure 132 or second edge structure 134 is free of a contact structure.

In some embodiments, semiconductor device 100 includes a substrate (not shown) and a semiconductor strip 110. In some embodiments, semiconductor strip 110 is called a fin and is part of a fin field effect transistor (FinFET). Semiconductor strip 110 extends above the substrate. In some embodiments, the substrate and semiconductor strip 110 are made of a same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some instances, the substrate is a silicon on insulator (SOI) layer substrate or a silicon on sapphire (SOS) substrate. In some embodiments, the substrate and semiconductor strip 110 are made of different materials. In some embodiments, semiconductor 100 is free of semiconductor strip 110, thereby each component is formed on a planar top surface of the substrate. Semiconductor strip 110 is surrounded by isolating features 112, which are also called insulating features. Isolating features 112 electrically isolate OD 124 of semiconductor device 100 from other ODs. Isolating features 112 are shallow trench isolation (STI), field oxide (FOX), or other suitable electrically insulating structures. In some instances, the formation of isolating regions 112 includes a photolithography process, an etch process to form trenches in semiconductor strip 110 or the substrate, and a deposition process to fill the trenches with one or more dielectric materials. In some embodiments, the formation of isolating features 112 includes another STI procedure or local oxidation of silicon (LOCOS).

In some embodiments, a capping oxide layer (not shown) is formed over semiconductor strip 110. In some instances, the formation of the capping oxide layer includes a thermal oxidation process. In some instances, the formation of the capping oxide layer includes a deposition process. Well region 122 is formed in semiconductor strip 110. In some embodiments, well region 122 extends into the substrate which is below isolating feature 112. Well region 122 is separated from another well region of an adjacent semiconductor device by isolating feature 112. For an n-type transistor, well region 122 is a p-well region with a p-type dopant such as boron, indium, or other suitable acceptor dopants. For a p-type transistor, well region 122 is an n-well region with an n-type dopant such as phosphorous, arsenic, antimony, or other suitable donor dopants. The formation of well region 122 includes an implantation process. In some embodiments, an anneal process is performed following the implantation process. In various embodiments, when gate structure 130 functions as a gate terminal of a transistor, semiconductor device 100 is free of well region 122.

Buried channel region 120 is formed in semiconductor strip 110 by an inhomogeneous implantation process. For the n-type transistor, buried channel region 120 is doped with a p-type dopant, such as boron, indium, or other suitable acceptor dopants. For the p-type transistor, buried channel region 120 is doped with an n-type dopant, such as phosphorus, arsenic, or other suitable donor dopants. Buried channel region 120 is formed below gate structure 130 and between first source/drain feature 140 and second source/drain feature 150. In some embodiments, a center portion of buried channel region 120 has a higher dopant concentration than end portions of buried channel region 120. The dopant concentration of buried channel region 120 has a Gaussian distribution along directions perpendicular to a longitudinal axis of semiconductor strip 110. In at least one embodiment, a highest dopant concentration of buried channel region 120 is in a portion of buried channel region 120 below gate structure 130. In at least one embodiment, a highest concentration of buried channel region 120 ranges from about 1.7E18 $cm^{-3}$ to about 2.0E20 $cm^{-3}$. If the concentration is too high or too low, then threshold voltage (Vt) will vary and result in a greater variation in process variations/corners making the manufacturing process less predictable. Buried channel region 120 is formed in the interior of semiconductor strip 110 away from surfaces of semiconductor strip 110. In some embodiments, buried channel region 120 is separated from a top surface of semiconductor strip 110 at a second distance D2. In some embodiments, first distance D1 and second distance D2 independently range from about 2 nanometers (nm) to about 7 nm. If first distance D1 or second distance D2 is too short, then flicker noise level will increase. If first distance D1 or second distance D2 is too long, then a short channel effect will increase, in some instances. For a gate voltage (Vg) between about Vt to about Vt+0.2 volt (V), a current density is maximized at the center portion of semiconductor strip 110, and the current mainly flows near center portion of semiconductor strip 110 and away from the surfaces of the semiconductor strip 110. In this regime, semiconductor device 100 exhibits low flicker noise level. In some embodiments, semiconductor device 100 has a core voltage or an I/O voltage. For example, in some embodiments, the core voltage is approximately from 0.8 V to 1.05V. For example, in some embodiments, the I/O voltage is 1.6V, 2.5V or 3.3V. In some embodiments, buried channel region 120 includes silicon germanium or III-V semiconductor materials. The formation of buried channel region 120 includes a photolithography process, an implantation process and an annealing process.

Gate structure 130, first edge structure 132 and second edge structure 134 are formed on semiconductor strip 110. In at least one embodiment, gate structure 130, first edge structure 132 and second edge structure 134 are on the top surface of the substrate when the substrate is free of semiconductor strip 110. Gate structure 130 is on completely on semiconductor strip 110 and between first edge structure 132 and second edge structure 134. First edge structure 132 and second edge structure 134 are partially on semiconductor strip 110 and partially on isolating regions 112. First edge structure 132 and second edge structure 134 do not function as gate terminals of a transistor, but are used to protect edges of semiconductor device 100. In some embodiments, multiple gate structures 130 are between first edge structure 132 and second edge structure 134. In some embodiments, first edge structure 132 and second edge structure 134 independently include dummy structures. In some embodiments, first edge structure 132 and second edge structure 134 are completely on isolating regions 112. Gate structure 130 is over well region 122. In some embodiments, when well region 122 extends into the substrate below isolating feature 112, first edge structure 132 and second edge structure 134 are also over well region 122; and gate structure 130, first source/drain region 140 and second source/drain region 150 share well region 122. In some embodiments, gate structure 130, first edge structure 132 and second edge structure 134 are formed by a gate-first methodology. In some embodiments, in order to increase a 1/gm frequency, first length L1 of gate structure 130 is decreased by about 1% to 3% than the minimum length rule under the design rules. For example, first length L1 of gate structure 130 is decreased through a masking layer formed using an optical proximity correction (OPC) process. If first length L1 is decreased too much, then a manufacturing process will be difficult to control, in some instances. If first length L1 is not sufficiently decreased, then an intended functionality will fail, in some instances. While first length L1 is decreased, in some instances, second length L2 of first edge structure 132 and second edge structure 134 follow the minimum length rule under the design rules. In some embodiments, the dummy structures are formed in a gate-last methodology or a hybrid process of gate-last and gate-first methodologies.

In some embodiments, in a gate-last methodology, also called a replacement gate methodology, each of gate structure 130, first edge structure 132 and second edge structure 134 are replaced from a dummy poly structure (not shown). The dummy poly structures, which are also called sacrificial poly structures, are initially formed on a same location as gate structure 130, first edge structure 132 and second edge structure 134, and are subsequently removed and replaced with one or more materials.

In some embodiments, dummy poly structures include a gate dielectric and/or a gate electrode. For example, the gate dielectric is silicon dioxide. In some embodiments, the silicon dioxide is a thermally grown oxide. In some embodiments, the gate dielectric is a high dielectric constant (high-k) dielectric material. A high-k dielectric material has a dielectric constant higher than that of silicon dioxide. In some embodiments, the gate electrode includes polycrystalline-silicon (poly-Si), poly-crystalline silicon-germanium (poly-SiGe), metallic nitride, metallic silicide, metallic oxide, metal, and/or other suitable layers. The formation of the gate electrode includes a deposition process and a subsequent etch process. In some embodiments, the dummy poly structures further include a hard mask layer over the gate electrode. Spacers (not shown) are along sidewalls of the dummy poly structures. The spacers include a dielectric material such as silicon oxide, silicon nitride, silicon oxynitride, silicon carbide, or combinations thereof. The formation of the spacers includes a procedure including deposition and etch back processes. In some embodiments, the spacers include an oxide-nitride-oxide (ONO) structure in some embodiments. In various embodiments, the spacers are patterned by performing an isotropic or an anisotropic etch process to form a D-shaped, I-shaped, or L-shaped spacers.

First source/drain feature 140 and second source/drain feature 150 are formed on opposite sides of gate structure 130. First source/drain feature 140 is between gate structure 130 and first edge structure 132; and second source/drain feature 150 is between gate structure 130 and second edge structure 134. In at least one embodiment, first source/drain feature 140 and second source/drain feature 150 are in well region 122 and buried channel region 120 is between first source/drain feature 140 and second source/drain feature 150. In some embodiments, second spacing S2, third spacing S3 and fourth spacing S4 follow the minimum spacing rule under the design rules. First spacing S1 is longer than second spacing S2 to form an asymmetric structure. In some embodiments, first source/drain feature 140 is a source terminal and second source/drain feature 150 is a drain terminal in a transistor. In some embodiments, first source/drain feature 140 is a drain terminal and second source/drain feature 150 is a source terminal in a transistor. Because a distance between gate structure 130 and first source/drain feature 140, i.e., first spacing S1, is longer than a distance between gate structure 130 and second source/drain feature 150, i.e., second spacing S2, a parasitic capacitance Cf will be reduced. For example, first spacing S1 is about three times greater than second spacing S2, in some embodiments. Fifth spacing S5 is longer than sixth spacing S6 so that a poly pitch between gate structure 130 and first edge structure 132 is longer than a poly pitch between gate structure 130 and second edge structure 134. In one or more embodiments, a ratio of first spacing S1 to second spacing S2 ranges from about 1.5 to about 4.5. If the ratio is too large, then semiconductor device 100 will occupy more area and a size of semiconductor device 100 is increased, in some instances. If the ratio is too small, then a functionality of semiconductor device 100 will fail, in some instances. In some embodiments, second spacing S2 is slightly longer than the minimum spacing rule while third spacing S3 and fourth spacing S4 still follow the minimum spacing rule. In some embodiments, semiconductor device 100 operates in a cutoff frequency higher than 350 GHz.

Portions of semiconductor strip 110 are removed to form recesses (not shown) adjacent to the dummy poly structure. Recesses are entirely within semiconductor strip 110. In some embodiments, when the substrate is free of semiconductor strip 110, recesses are formed by removing portions of the substrate. A filling process is subsequently performed by filling the recesses with one or more semiconductor materials. The formation of the recesses includes an etch process, such as a wet etching or a dry etching. In some embodiments, the filling process is performed by an epitaxial (epi) process. In some embodiments, first source/drain feature 140 and second source/drain feature 150 are independently formed using an implantation process. In some embodiments, first source/drain feature 140 and second source/drain feature 150 are formed in a hybrid procedure of epi process and implantation process. For example, first source/drain feature 140 and second source/drain feature 150 are grown by the epi process. P-type transistors include an implantation process with a P+ ion dopant to form source/drain feature 140 and second source/drain feature 150. N-type transistors do not include an implantation process with an N+ ion dopant. Semiconductor device 100 is free of lightly-doped drain (LDD) region.

After the formation of first source/drain feature 140 and second source/drain feature 150, the gate dielectric and the gate electrode are removed from the dummy poly structures to form an opening in some embodiments which include a gate-last process. In some embodiments, the gate electrode is removed while the gate dielectric remains on the top surface of semiconductor strip 110. Gate structure 130 includes a first dielectric portion over semiconductor strip 110. In some instances, the first dielectric portion is called an interfacial layer. Gate structure 130 further includes a second dielectric portion over the first dielectric portion. In some instances, the second dielectric portion is called a gate dielectric layer. The second dielectric portion has a U-shape or a rectangular shape. A conductive material is over the second dielectric portion. In some embodiments, the conductive material is tungsten. In some embodiments, the conductive material includes different materials such as titanium, nickel, or tantalum, and has a work function suitable for a p-type transistor or an n-type transistor. When the second dielectric portion has the rectangular shape, the conductive material contacts the spacers. When the second dielectric portion has a U shape, the second dielectric portion separates the conductive material form the spacers. In some embodiments, a capping layer is over the conductive material.

Contact structures 160, 162, 164, 166, 168 couple to gate structure 130, first edge structure 132, second edge structure 134, first source/drain feature 140, and second source/drain feature 150, respectively. In some embodiments, contact structures 160, 162, 164, 166, 168 are contact plugs. In some embodiments, contact structures 160, 162, 164, 166, 168 are slot contacts that function as interconnects for semiconductor device 100. When contact structures 160, 162, 164, 166, 168 are slot contacts, a via is between first source/drain feature 140 and contact structure 166, in some instances. When first spacing S1 is three times greater than second spacing S2, a distance between gate structure 130 and contact structure 166 is also three times greater than a distance between gate structure 130 and contact structure 168, thereby decreasing parasitic capacitance Cco. If the ratio is too large, then semiconductor device 100 will occupy more area and a size of semiconductor device 100 is increased, in some instances. If the ratio is too small, then a functionality of semiconductor device 100 will fail, in some instances. Contact structures 160, 162, 164, 166, 168 include a conductive portion and a liner portion. The conductive portion is laterally surrounded by the liner portion. First metal line layers 170, 172, 174, 176, 178 couple to contact structures 160, 162, 164, 166, 168, respectively. When contact structures 160, 162, 164, 166, 168 are slot contacts, semiconductor device 100 is free of first metal line layers 170, 172, 174, 176, 178; and via plugs are on each of contact structures 160, 162, 164, 166, 168 are slot contacts. When first spacing S1 is three times greater than second spacing S2, a distance between gate structure 130 and first metal line layer 176 is also three times greater than a distance between gate structure 130 and second metal line layer 178, thereby decreasing parasitic capacitance Cm. In such an asymmetric arrangement, parasitic capacitances Cf, Cco and Cm are reduced and a speed of semiconductor device 100 is enhanced. If the ratio is too large, then semiconductor device 100 will occupy more area and a size of semiconductor device 100 is increased, in some instances. If the ratio is too small, then a functionality of semiconductor device 100 will fail, in some instances.

Figure 2A:
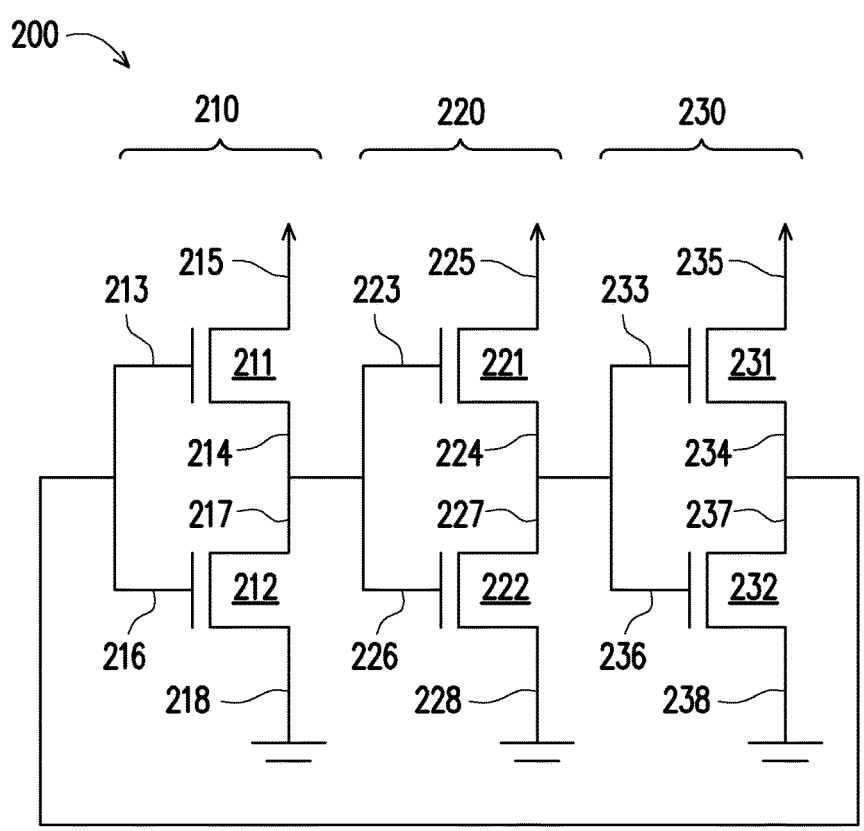
FIG. 2A is a schematic diagram of a ring oscillator including a semiconductor device in accordance with one or more embodiments.

FIG. 2A is a schematic diagram of a ring oscillator 200 including a semiconductor device in accordance with one or more embodiments. In some embodiments, the semiconductor device is semiconductor device 100 (FIG. 1A). Ring oscillator 200 includes a first invertor 210, a second invertor 220 and a third invertor 230. In some embodiments, ring oscillator 200 includes more than three inverters, as long as there are an odd number of inverters, i.e., a NOT gate. In digital logic, a NOT gate implements logical negation. First invertor 210 includes a first p-type transistor 211 (also called a pull-down transistor) and a first n-type transistor 212 (also called a pull-up transistor). Second inventor 220 includes a second p-type transistor 221 and a second n-type transistor 222. Third inventor 230 includes a third p-type transistor 231 and a third n-type transistor 232. First p-type transistor 211 includes a gate terminal 213, a drain terminal 214 and a source terminal 215. First n-type transistor 212 includes a gate terminal 216, a drain terminal 217, and a source terminal 218. Gate terminal 213 couples to gate terminal 216, and drain terminal 214 couples drain terminal 217. Second p-type transistor 221 includes a gate terminal 223, a drain terminal 224 and a source terminal 225. Second n-type transistor 222 includes a gate terminal 226, a drain terminal 227 and a source terminal 228. Gate terminal 223 couples to gate terminal 226, and drain terminal 224 couples drain terminal 227. Third p-type transistor 231 includes a gate terminal 233, a drain terminal 234 and a source terminal 235. Third n-type transistor 232 includes a gate terminal 236, a drain terminal 237 and a source terminal 238. Gate terminal 233 couples to gate terminal 236, and drain terminal 234 couples drain terminal 237.

Figure 2B:
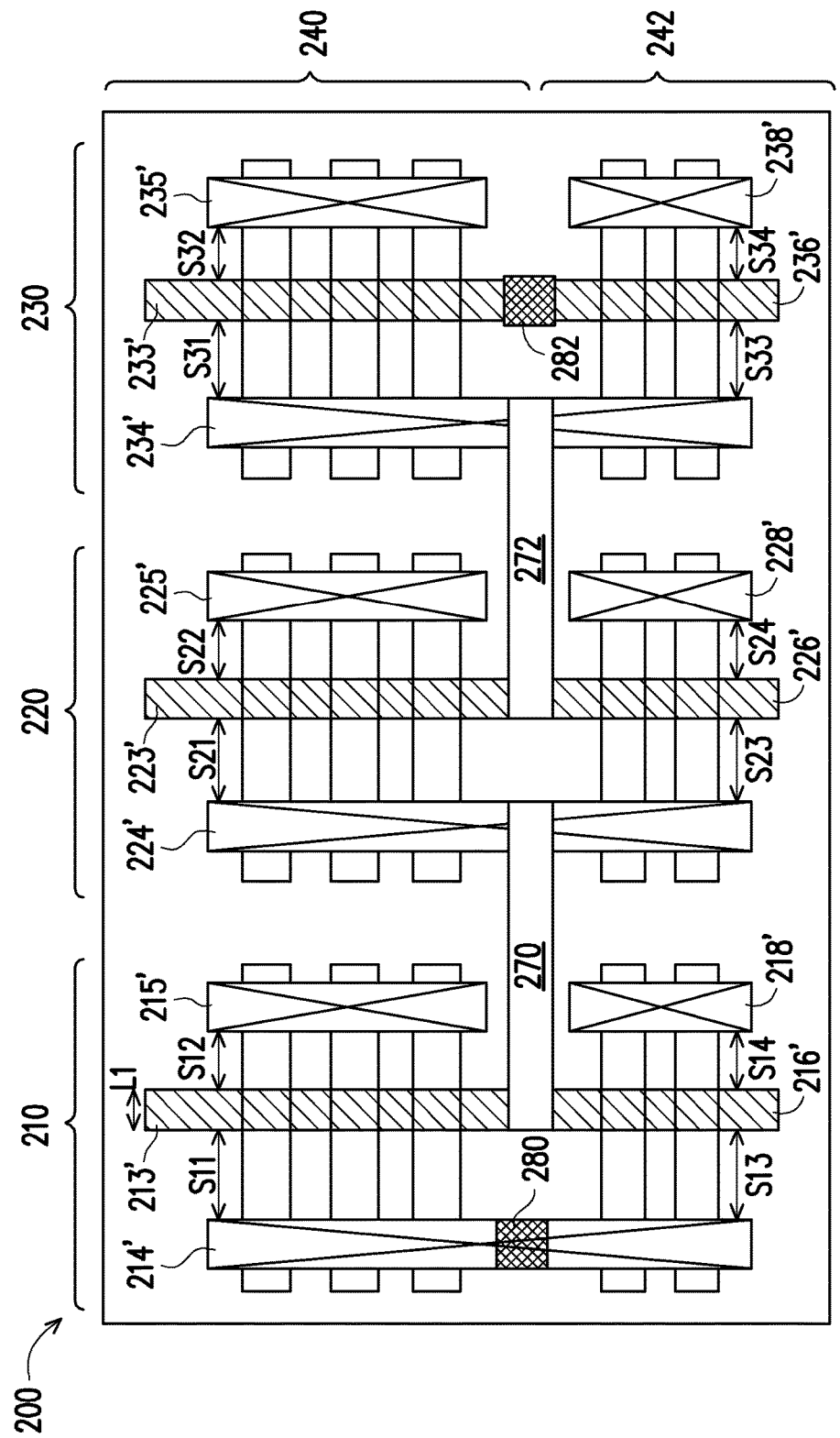
FIG. 2B is a schematic layout diagram of the ring oscillator of FIG. 2A in accordance with one or more embodiments.

FIG. 2B is a layout diagram of ring oscillator 200 in accordance with one or more embodiments. Ring oscillator 200 includes two fin active regions 240 and 242. For example, fin active region 240 is in an n-well region and fin active region 242 is in a p-well region. First inverter 210 includes a gate feature 213', a drain feature 214' and source features 215' and 218'. Second inverter 220 includes a gate feature 223', a drain feature 224' and source features 225' and 228'. Third inverter 230 includes a gate feature 233', a drain feature 234' and source features 235' and 238'. Gate feature 213' electrically couples to drain feature 224' by a connection feature 270, and gate feature 223' electrically couples to drain feature 234' by a connection feature 272. In some embodiments, drain features 224' and 234' correspond to a slot contact layer and connection features 270 and 272 correspond to a first metal layer. In some embodiments, drain features 224' and 234' correspond to the first metal layer and connection features 270 and 272 correspond to a second metal layer. Gate feature 233' electrically couples to drain feature 214' to form a ring oscillator. In some embodiments, gate feature 233' connects to drain feature 214' in the first metal layer. In some embodiments, gate feature 233' connects to drain feature 224' in the second metal layer by vias 280 and 282.

In some embodiments, in order to increase an operating speed of ring oscillator 200, a spacing between a gate feature and a drain feature is longer than a spacing between the gate feature and a source feature. In some embodiments, ring oscillator 200 includes a spacing between the gate feature and the source feature longer than the spacing between the gate feature and the drain feature. For example, spacings S11, S13, S21, S23, S31 and S33 are longer than spacings S12, S14, S22, S24, S32 and S34, respectively. In some embodiments, spacings S12-S34 follow a minimum spacing rule under the design rules and spacings S11-S33 are about three times greater than the minimum spacing rule. In some embodiments, a ratio between spacings S11-S33 to spacings S12-S34, respectively, ranges from about 1.5 to about 4.5. If the ratio is too large, then ring oscillator 200 will occupy more area. If the ratio is too small, then a functionality of ring oscillator 200 will fail, in some instances. In some embodiments, only spacings S11, S21 and S31 are extended with respect to the minimum spacing rule, while other spacings follow the minimum spacing rule. In some embodiments, only spacings S12, S22 and S32 are extended with respect to the minimum spacing rule, while other spacings follow the minimum spacing rule. In some embodiments, each of first inverter 210, second inverter 220 and third inverter 230 has a delay time less than about 76 picosecond (ps).

Figure 3:
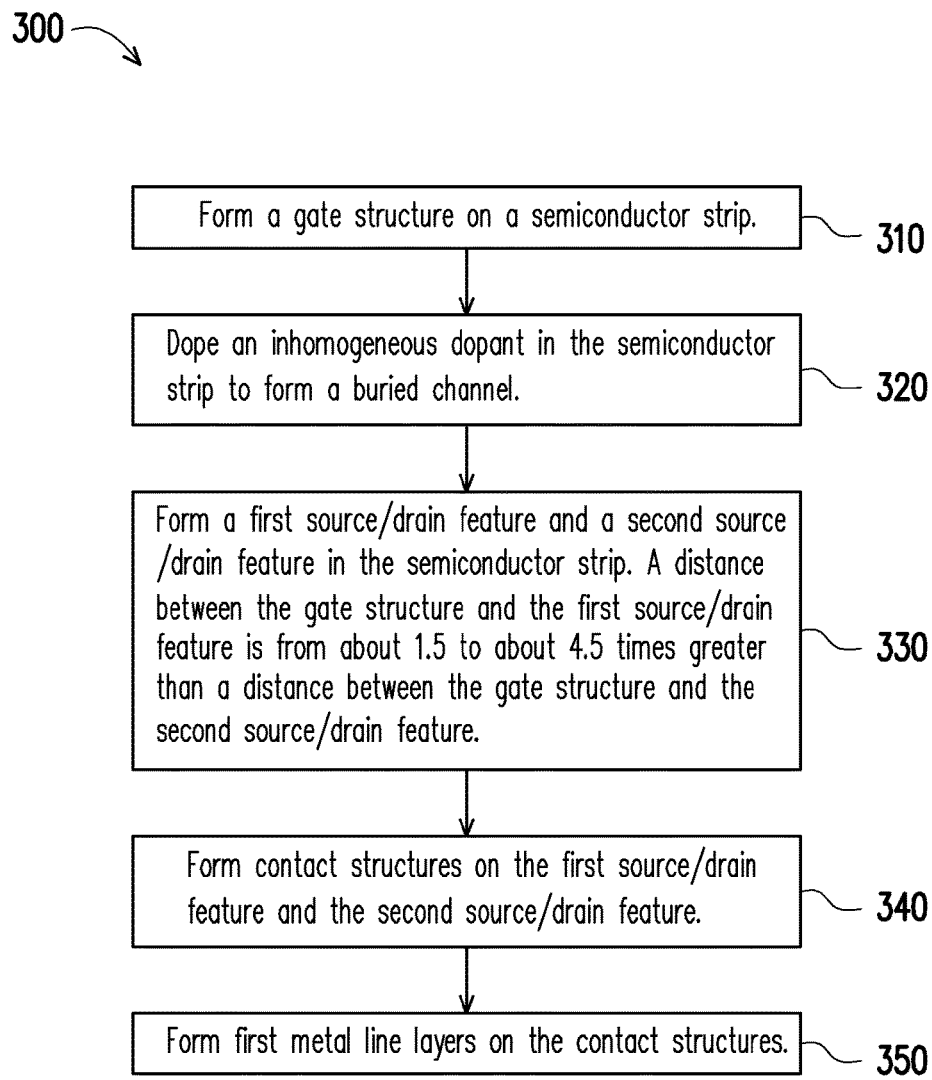
FIG. 3 is a flow chart of a method of fabricating a semiconductor device in accordance with one or more embodiments.

FIG. 3 is a flow chart of a method 300 of fabricating a semiconductor device in accordance with one or more embodiments. Method 300 includes operation 310 in which a gate structure is formed on a semiconductor strip. In some embodiments, a length of the gate structure is reduced through a masking layer formed using an OPC process. In some embodiments, the gate structure is formed on a substrate to form a planar semiconductor device.

At operation 320, an inhomogeneous dopant is doped in the semiconductor strip to form a buried channel. In some embodiments, the buried channel is separated from a top surface and side surfaces of the semiconductor strip at a distance ranging from about 2 nm to about 7 nm.

At operation 330, a first source/drain feature and a second source/drain feature are formed in the semiconductor strip, and a distance between the gate structure and the first source/drain feature is from about 1.5 to about 4.5 times greater than a distance between the gate structure and the second source/drain feature. In some embodiments, the first source/drain feature is a source terminal of a transistor and the second source/drain feature is a drain terminal of the transistor. In some embodiments, the first source/drain feature is a drain terminal of the transistor and the second source/drain feature is a source terminal of the transistor. In some embodiments, the distance between the gate structure and the second source/drain feature is kept in a minimum spacing under design rules.

At operation 340, contact structures are formed on the first source/drain feature and the second source/drain feature. In some embodiments, the contact structures are contact plugs. In some embodiments, the contact structures are slot contacts.

At operation 350, first metal line layers are formed on the contact structures. For example, first metal layers 176 and 178 are coupled to contact structures 166 and 168. When contact structures 166 and 168 are slot contacts, the semiconductor device is free of first metal layers 175 and 178.

Semiconductor devices 100 and ring oscillator 200 may undergo further processes to complete fabrication. For example, in some embodiments, a first passivation layer is formed on a topmost inter-metal dielectric layer and a second passivation layer is formed on the first passivation layer. In some embodiments, the first passivation layer and the second passivation layer independently include oxides, nitrides, and combinations thereof. Semiconductor devices 100 and ring oscillator 200 further include an aluminum ring (alternatively referred to as aluminum pad or pad ring) over, and physically connected to a topmost metal layer. The aluminum ring may include a portion over the first passivation layer and a portion penetrating into the first passivation layer. The aluminum ring is formed simultaneously with the formation of bond pads (not shown) exposed on a top surface of semiconductor devices 100 and ring oscillator 200.

One aspect of this description relates to a semiconductor device. The semiconductor device includes a fin extending from a substrate, a first source/drain feature, a second source/drain feature, and a gate structure on the fin. A distance between the gate structure and the first source/drain feature is different from a distance between the gate structure and the second source/drain feature.

Another aspect of this description relates to a semiconductor device. The semiconductor device includes a first transistor having a first gate structure, a first source feature, a first drain feature and a first pair of contact structures, and a second transistor having a second gate structure, a second source feature, a second drain feature and a second pair of contact structures. The first source feature and the first drain feature are in a first well region, and a distance between the first gate structure and one contact structure of the first pair of contact structures is longer than a distance between the first gate structure and the other contact structure of the first pair of contact structures. The second source feature and the second drain feature are in a second well region, and a distance between the second gate structure and one contact structure of the second pair of contact structures is longer than a distance between the second gate structure and the other contact structure of the second pair of contact structures.

Still another aspect of this description relates to a method of fabricating a semiconductor device. The method includes forming a gate structure, a first edge structure and a second edge structure on a semiconductor strip, forming a first source/drain feature between the gate structure and the first edge structure, and forming a second source/drain feature between the gate structure and the second edge structure. A distance between the gate structure and the first source/drain feature is from about 1.5 to about 4.5 times greater than a distance between the gate structure and the second source/drain feature.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods, operations, and steps described in the specification. As one of ordinary skill in the art will readily appreciate from the disclosure, processes, machines, manufacture, compositions of matter, means, methods, operations, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, operations, or steps. In addition, each claim constitutes a separate embodiment, and the combination of various claims and embodiments are within the scope of the disclosure.

What is claimed is:

1. A semiconductor device comprising:
    a fin extending from a substrate;
    a first source/drain feature;
    a second source/drain feature;
    a gate structure on the fin, wherein a first distance between the gate structure and the first source/drain feature is different from a second distance between the gate structure and the second source/drain feature; and
    a buried channel extending from a sidewall of the first source/drain feature to a sidewall of the second source/drain feature, wherein a top surface of the buried channel is spaced from a top surface of the substrate and a bottom surface of the buried channel is closer to the top surface of the substrate than a bottom surface of the first source/drain feature;
    dopants in the buried channel, wherein a highest concentration of the dopants is under the gate structure.

2. The semiconductor device of claim 1, wherein a ratio between the first distance and the second distance ranges from about 1.5 to about 4.5.

3. The semiconductor device of claim 1, wherein the top surface of the buried channel region is spaced from a top surface of the fin by a distance ranging from about 2 nanometers (nm) to about 7 nm.

4. The semiconductor device of claim 3, wherein end portions of the buried channel region contact the first source/drain feature and the second source/drain feature, and a center portion of the buried channel region has a higher concentration of dopants than the end portions of the buried channel region.

5. The semiconductor device of claim 1, further comprising:
    a first edge structure and a second edge structure on opposite sides of the gate structure, wherein the first source/drain feature is between the first edge structure and the gate structure and the second source/drain feature is between the second edge structure and the gate structure, and a distance between the first edge structure and the first source/drain feature is substantially equal to a distance between the second edge structure and the second source/drain feature.

6. The semiconductor device of claim 5, wherein a length of the gate structure is about 1% to 3% shorter than a length of the first edge structure or a length of the second structure.

7. The semiconductor device of claim 1, further comprising:
    a first contact structure coupling to the first source/drain feature and a second contact structure coupling to the second source/drain feature, wherein a capacitance between the first contact structure and the gate structure is smaller than a capacitance between the second contact structure and the gate structure.

8. The semiconductor device of claim 1, wherein the semiconductor device is free of a lightly-doped drain (LDD) region.

9. The semiconductor device of claim 1, wherein the semiconductor device has a cutoff frequency higher than 350 GHz.

10. A semiconductor device comprising:
    a first transistor having a first gate structure, a first source feature, a first drain feature and a first pair of contact structures, wherein the first source feature and the first drain feature are in a first well region, a first distance between the first gate structure and one contact structure of the first pair of contact structures is longer than a second distance between the first gate structure and the other contact structure of the first pair of contact structures, and the first transistor further comprises:
        a buried channel spaced from a top surface of a substrate, wherein a bottom surface of the buried channel is closer to the top surface of the substrate than a bottom surface of the first source feature;
        dopants in the buried channel, wherein a highest concentration of the dopants is under the first gate structure; and
    a second transistor having a second gate structure, a second source feature, a second drain feature and a second pair of contact structures, wherein the second source feature and the second drain feature are in a second well region, and a third distance between the second gate structure and one contact structure of the second pair of contact structures is longer than a fourth distance between the second gate structure and the other contact structure of the second pair of contact structures.

11. The semiconductor of claim 10, wherein the first transistor is an n-type transistor and the second transistor is a p-type transistor.

12. The semiconductor of claim 10, wherein the first gate structure couples to the second gate structure and the first drain feature couples to the second drain feature to form an inverter, wherein the inverter has a delay time less than 76 picoseconds.

13. The semiconductor of claim 10, wherein a ratio between the first distance and the second distance is from about 4.5 to about 1.5, or a ratio between the third distance and the fourth distance is from about 4.5 to about 1.5.

14. The semiconductor of claim 10, wherein the second transistor has a second buried channel region different from the buried channel region.

15. The semiconductor of claim 10, further comprising:
    a first pair of edge structures on opposite sides of the first gate structure, wherein the first source feature is between the first gate structure and one edge structure of the first pair of edge structures and the first drain feature is between the first gate structure and the other edge structure of the first pair of edge structures; and
    a second pair of edge structures on opposite sides of the second gate structure, wherein the second source feature is between the second gate structure and on edge structure of the second pair of edge structures and the second drain feature is between the second gate structure and the other edge structure of the second pair of edge structures.

16. The semiconductor of claim 15, wherein a length of the first gate structure is about 1% to 3% shorter than a length of the first pair of edge structures, and a length of the second gate structure is about 1% to 3% shorter than a length of the second pair of edge structures.

17. The semiconductor of claim 15, wherein a distance between the first source feature and the one edge structure of the first pair of edge structures is subsequently equal to a distance between the first drain feature and the other edge structure of the first pair of edge structures.

18. The semiconductor of claim 10, wherein the first source feature and the first drain feature are free of n-type dopants.

19. The semiconductor of claim 10, wherein the first transistor or the second transistor has a 0.08 volt threshold voltage or a 1.8 volt threshold voltage.

20. A semiconductor device comprising:
a fin extending from a substrate;
a first source/drain feature, wherein a top surface of the first source/drain feature extends above a top surface of the fin;
a second source/drain feature, wherein a top surface of the second source/drain feature extends above the top surface of the fin, and the fin comprises a buried channel region between the first source/drain feature and the second source/drain feature;
a gate structure on the fin, wherein the gate structure is closer to the first source/drain feature than to the second source/drain feature;
a buried channel in the substrate extending from a sidewall of the first source/drain feature to a sidewall of the second source/drain feature, wherein a top surface of the buried channel is spaced from a top surface of the substrate, and a depth, from the top surface of the substrate, of a bottom surface of the buried channel is less than a depth of a bottom surface of the first source/drain feature; and
dopants in the buried channel, wherein a highest concentration of the dopants is under the gate structure.

* * * * *